United States Patent
Sivananthan et al.

(10) Patent No.: US 9,455,364 B2
(45) Date of Patent: Sep. 27, 2016

(54) TUNNEL HOMOJUNCTIONS IN GROUP IV / GROUP II-VI MULTIJUNCTION SOLAR CELLS

(75) Inventors: Sivalingam Sivananthan, Naperville, IL (US); Michael Carmody, Western Springs, IL (US); Robert W. Bower, Anacortes, WA (US); Shubhrangshu Mallick, Romeoville, IL (US); James Garland, Aurora, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 679 days.

(21) Appl. No.: 12/683,197

(22) Filed: Jan. 6, 2010

(65) Prior Publication Data

US 2011/0162697 A1   Jul. 7, 2011

(51) Int. Cl.
*H01L 31/00* (2006.01)
*H01L 31/078* (2012.01)
(Continued)

(52) U.S. Cl.
CPC ........... *H01L 31/078* (2013.01); *H01L 31/028* (2013.01); *H01L 31/0296* (2013.01); *H01L 31/02363* (2013.01); *H01L 31/042* (2013.01); *H01L 31/0687* (2013.01); *H01L 31/0725* (2013.01); *H01L 31/0368* (2013.01); *H01L 31/048* (2013.01); *H01L 31/0445* (2014.12); *H01L 31/054* (2014.12);
(Continued)

(58) Field of Classification Search
CPC ............ H01L 31/078; H01L 31/0725; H01L 31/042; H01L 31/02363; H01L 31/0368; H01L 31/048; H01L 31/0687; H01L 31/054; H01L 31/0445; H01L 31/028; H01L 31/0296; H01L 31/1836; H02S 31/10; Y02E 10/544; Y02E 10/52

USPC .................. 136/252, 255, 256, 258
See application file for complete search history.

(56) References Cited

U.S. PATENT DOCUMENTS

| 7,148,417 B1 * | 12/2006 | Landis .......................... 136/262 |
| 2003/0102432 A1 | 6/2003 | Boieriu et al. |
| 2010/0096001 A1 | 4/2010 | Sivananthan et al. |

FOREIGN PATENT DOCUMENTS

EP           024853 A1 * 12/1987 ............. H01L 31/06

OTHER PUBLICATIONS

Ferreira, S.O. et al., "Growth of highly doped p-type ZnTe layers on GaAs using a nitrogen DC plasma cell," Journal of Crystal Growth (1994) 282-286, 140.
Johs, B. et al., "Real-time monitoring and control of epitaxial semiconductor growth in a production environment by in situ spectroscopic ellipsometry," Thin Solid Films (1998) 490-495, 313.
Sporken, R. et al., "Si 2p core-level shifts at the CdTe / Si (100) interface," Applied Surface Science (1998) 462-466, 123/124.

(Continued)

*Primary Examiner* — Matthew Martin
(74) *Attorney, Agent, or Firm* — Perkins IP Law Group LLC; Jefferson Perkins

(57) ABSTRACT

A photovoltaic cell comprises a first subcell formed of a Group IV semiconductor material, a second subcell formed of a Group II-VI semiconductor material, and a tunnel homojunction interposed between the first and second subcells. A first side of the tunnel homojunction is formed by a first layer that is adjacent to a top surface of the first subcell. The first layer is of a first conductivity type and is comprised of a highly doped Group IV semiconductor material. The other side of the tunnel homojunction is formed by a second layer that adjoins the lower surface of the second subcell. The second layer is of a second conductivity type opposite the first conductivity type and also is comprised of a highly doped Group IV semiconductor material. The tunnel homojunction permits photoelectric series current to flow through the subcells.

4 Claims, 2 Drawing Sheets

(51) Int. Cl.
    *H01L 31/042*     (2014.01)
    *H01L 31/0296*     (2006.01)
    *H01L 31/0725*     (2012.01)
    *H01L 31/0236*     (2006.01)
    *H01L 31/0687*     (2012.01)
    *H01L 31/028*     (2006.01)
    *H01L 31/048*     (2014.01)
    *H01L 31/0368*     (2006.01)
    *H01L 31/054*     (2014.01)
    *H02S 30/10*     (2014.01)
    *H01L 31/18*     (2006.01)
    *H01L 31/0445*     (2014.01)

(52) U.S. Cl.
    CPC ........... *H01L 31/1836* (2013.01); *H02S 30/10* (2014.12); *Y02E 10/50* (2013.01); *Y02E 10/52* (2013.01); *Y02E 10/544* (2013.01)

(56) References Cited

OTHER PUBLICATIONS

He, L. et al., "MBE HgCdTe on Si and GaAs substrates," Journal of Crystal Growth (2007) 268-272, 301-302.

Dhar, N.K. et al., "Heteroepitaxy of CdTe on {211} Si using crystallized amorphous ZnTe templates," J. Vac. Sci. Technol., May/Jun. 1996, 2366-2370, B14(3).

Jaime-Vazquez, M. et al., "In-situ Spectroscopic Study of the As and Te on the Si (112) Surface for High-quality Epitaxial Layers," J. Electron. Mater. (2006) 1455-1460, vol. 35, No. 6.

Sen, P. et al., "Finite temperature studies of Te adsorption on Si(001)," Surface Science (2002) 79-89, 519.

Sen, P. et al., "Electronic structure of Te- and As-covered Si(211)," Phys. Rev. (2003) 045314, B 68.

Baron, T. et al., "Plasma nitrogen doping of ZnTe, Cd1-xNzxTe, and CdTe by molecular beam epitaxy," Appl. Phys. Lett. Sep. 5, 1994, 1284-1286, 65 (10).

\* cited by examiner

TUNNEL HOMOJUNCTIONS IN GROUP IV / GROUP II-VI MULTIJUNCTION SOLAR CELLS

BACKGROUND OF THE INVENTION

To achieve high energy conversion efficiency for a semiconductor photovoltaic solar cell, a high output voltage and a high current are required. In order to take advantage of narrow and wide band gap photovoltaic materials, a multijunction photovoltaic solar cell architecture approach has been proposed in which the cell includes a number of stacked photovoltaic solar subcells each with different base layer energy gaps. By connecting the photovoltaic solar cells in a serial fashion with the base layer energy gaps covering different portions of the solar spectrum, enhanced energy conversion efficiency can be achieved.

However, it has proven difficult to provide a path for a photogenerated current to pass from a Group II-VI semiconductor layer to a Group IV semiconductor layer. For example, FIGS. 1A and 1B show that a blocking contact is formed when a p-type ZnTe layer 100 is joined to either light or moderately doped p-type silicon 102 or n-type silicon 104. As is illustrated in FIG. 2, since it is difficult to form stable n-type ZnTe layers, even a highly doped (n++) silicon layer 200 will not form a nonblocking path from a Group II-VI layer 202 (such as ZnTe) to a lightly to moderately doped p-type Group IV layer 204 (such as silicon). Thus, there is a need for a nonblocking path between adjacent subcells where these are formed of a Group IV semiconductor on the one hand and a Group II-VI semiconductor on the other.

SUMMARY OF THE INVENTION

According to one aspect of the invention, a photovoltaic cell comprises a first subcell formed of a Group IV semiconductor material, a second subcell formed of a Group II-VI semiconductor material, and a tunnel homojunction interposed between the first and second subcells. The tunnel homojunction has two Group IV semiconductor layers, preferably highly doped silicon. A first homojunction layer is adjacent to an upper surface of the first subcell. The first layer has a first conductivity type and forms one side of the tunnel homojunction.

A second layer of the tunnel homojunction adjoins the first layer and is adjacent to a lower surface of the second subcell. The second layer is highly doped to be of a second conductivity type opposite the first conductivity type and forms the other side of the tunnel homojunction.

According to a second aspect of the invention, a method of passing photovoltaic current from a second subcell formed from a Group II-VI material to a first subcell formed from a Group IV material comprises the step of forming a tunnel homojunction between the first subcell and the second subcell. The step of forming the tunnel homojunction includes the substeps of forming a first layer in a Group IV semiconductor material to be of a first conductivity type, and to be adjacent to a top surface of the first subcell, and the substep of forming a second layer in a Group IV semiconductor material to be of a second conductivity type opposite the first conductivity type. Suitable Group IV materials include germanium, strained silicon-germanium, and silicon. The second homojunction layer is formed to be adjacent to a bottom surface of the second subcell. Hole-electron pairs generated by light incident on the cell may tunnel through the homojunction between the subcells, thereby permitting the efficient generation of a photoelectric series current through both subcells.

BRIEF DESCRIPTION OF THE DRAWINGS

Further aspects of the invention and their advantages can be discerned in the following detailed description, in which like characters denote like parts and in which.

DETAILED DESCRIPTION

The invention relates to photovoltaic cells and methods of passing current from a subcell having a Group II-VI semiconductor material to a subcell formed of a Group IV semiconductor material through the use of a tunnel homojunction. Contemplated Group II-VI materials used herein include CdS, CdTe, CdSe, ZnTe, ZnSe, ZnS, MgTe, CdSeTe, CdZnTe, CdMnTe, CdMgTe, CdHgTe, and composites thereof. Contemplated Group IV materials used herein include silicon, germanium, strained silicon germanium, and silicon-germanium. Preferred materials systems include ZnTe for the Group II-VI structures described herein and elemental silicon for the Group IV structures described herein.

Figure 1A:
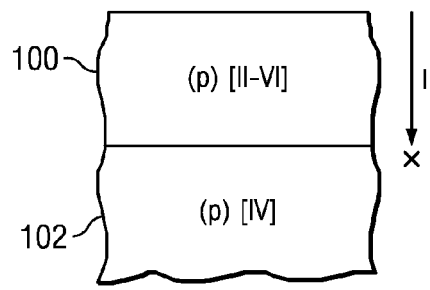
FIG. 1A is a highly magnified schematic elevational sectional view showing the interface of a p-type Group II-VI semiconductor layer with a p-type Group IV semiconductor layer and showing that their interface is a blocking contact.
Figure 1B:
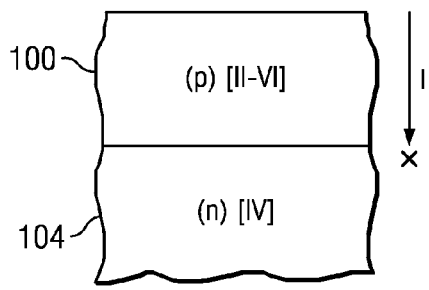
FIG. 1B is a highly magnified schematic elevational sectional view showing the interface of a p-type Group II-VI semiconductor layer with an n-type Group IV semiconductor layer and showing that their interface is a blocking contact.
Figure 2:
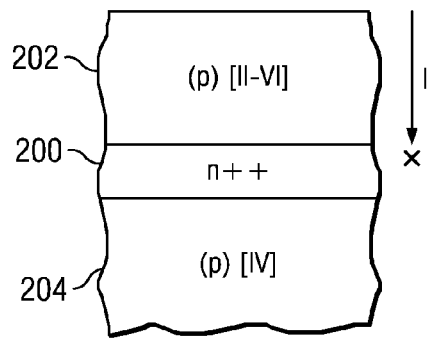
FIG. 2 is a highly magnified schematic elevational sectional view of a p-type Group II-VI semiconductor layer, a p-type Group IV semiconductor layer, and an interface positioned therebetween of a degenerately doped n-type Group IV semiconductor layer, showing that a photogenerated current cannot cross the interface.
Figure 3:
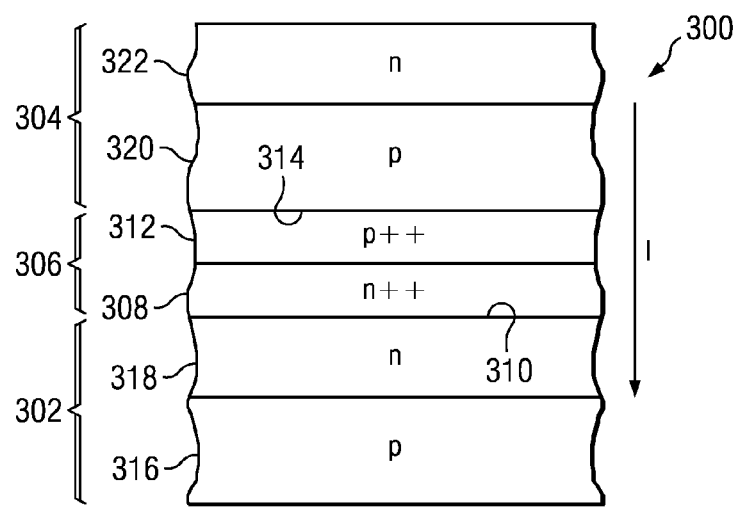
FIG. 3 is a highly magnified schematic elevational sectional view of a portion of a multijunction photovoltaic cell according to a first embodiment of the present invention.

Referring to FIG. 3, a multijunction photovoltaic cell, indicated generally at 300, comprises a first subcell 302 formed of a Group IV semiconductor material, a second subcell 304 formed of a Group II-VI semiconductor material that is optically coupled to the Group IV subcell 302, and a tunnel junction 306 interposed between the first and second subcells 302, 304. The photovoltaic cell 300 is so constructed that incident light first enters the second, Group II-VI subcell 304, where a relatively energetic portion (such as a bluer portion of the solar spectrum) gets converted into hole-electron pairs. The remainder of the incident light continues through the tunnel junction 306 and into the first, Group IV subcell, where a redder portion of the incident light will also generate hole-electron pairs. It is an objective of the invention to provide a nonblocking path between the subcells 304 and 302, inducing a photoelectric series current I to flow through cells 304 and 302.

The tunnel junction 306 includes a first layer 308 that is adjacent to an upper surface 310 of the first, Group IV subcell 302. The first layer 308 comprises Group IV semiconductor material and is highly doped such that layer 308 forms one side of the tunnel homojunction. Layer 308 has a first conductivity type, in this illustrated embodiment chosen as (n). A second layer 312 adjoins the first tunnel junction layer 308 and is adjacent to a lower surface 314 of the second subcell 304. The second layer 312 also comprises a Group IV semiconductor material that has been highly doped so that layer 312 forms the other side of the tunnel homojunction. It is preferred that layers 308, 312 be constituted primarily of silicon but may comprise strained silicon-germanium or germanium. Layer 312 has a second conductivity type (here, (p)) that is opposite the first conductivity type. To permit the quantum tunneling of carriers between the sides of the tunnel homojunction 306, it is necessary that tunnel junction 306 be thin, such as 0.005 to 0.1 µm. A thin tunnel junction will also reduce optical power loss. The first subcell 302 has a p-type base 316 and an n-type emitter 318. The second subcell 304 has a p-type base 320 and an n-type emitter 322. In another, nonillustrated embodiment, the depicted conductivity types can be reversed, such that the bases are n-type, the emitters are p-type, and the tunnel homojunction has a p++ lower layer and an n++ upper layer. This reversal of conductivity types from the illustrated embodiment may require the use of II-VI semiconductor alloys for subcell 304 that are different from those (such as ZnTe) preferred to be used in the illustrated embodiment.

The cell 300 can be finished as a tandem solar cell with only two subcells 302, 304. In this instance, a back contact (not shown) may be formed to adjoin a bottom surface of the Group IV base 316. An antireflection layer and a front contact (neither shown) may be formed to be adjacent an upper surface of the Group II-VI emitter 322.

Figure 4:
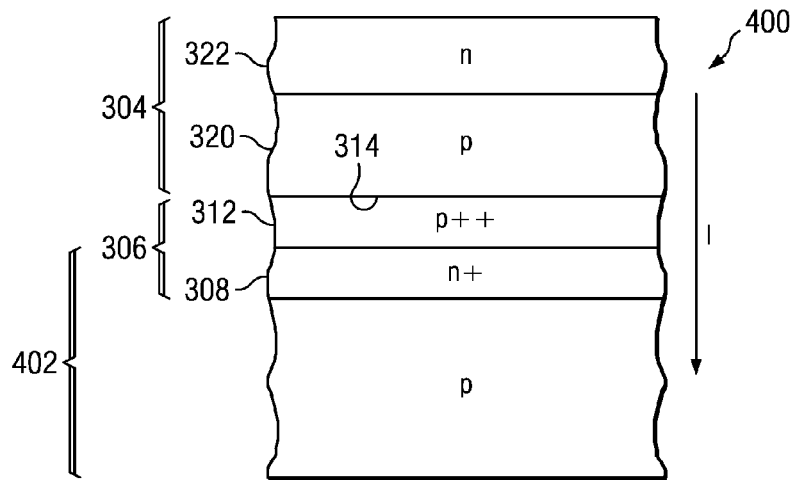
FIG. 4 is a highly magnified schematic elevational sectional view of a portion of a multijunction photovoltaic cell according to a second embodiment of the present invention.

In an alternative embodiment shown in FIG. 4, a multi junction photovoltaic cell indicated generally at 400 has a first subcell 402, a tunnel homojunction 306, and a second subcell 304. The structure of the second, Group II-VI subcell 304 and of the tunnel homojunction 306 is the same as that described in the embodiment illustrated in FIG. 3. The first, Group IV subcell 402 is formed by a base 404 that is lightly doped to be of the second conductivity type (here, (p)) and by the adjacent tunnel junction layer 308. The (n) doping of homojunction layer 308 should be sufficient for a pronounced and abrupt change in the energy levels of the valence and conduction bands to occur between the (p) and (n) sides of the homojunction, thereby permitting tunneling. The doping concentration may be moderate to high. In this embodiment, layer 308 acts as the emitter of cell 402 as well as one side of homojunction 306.

Figure 5:
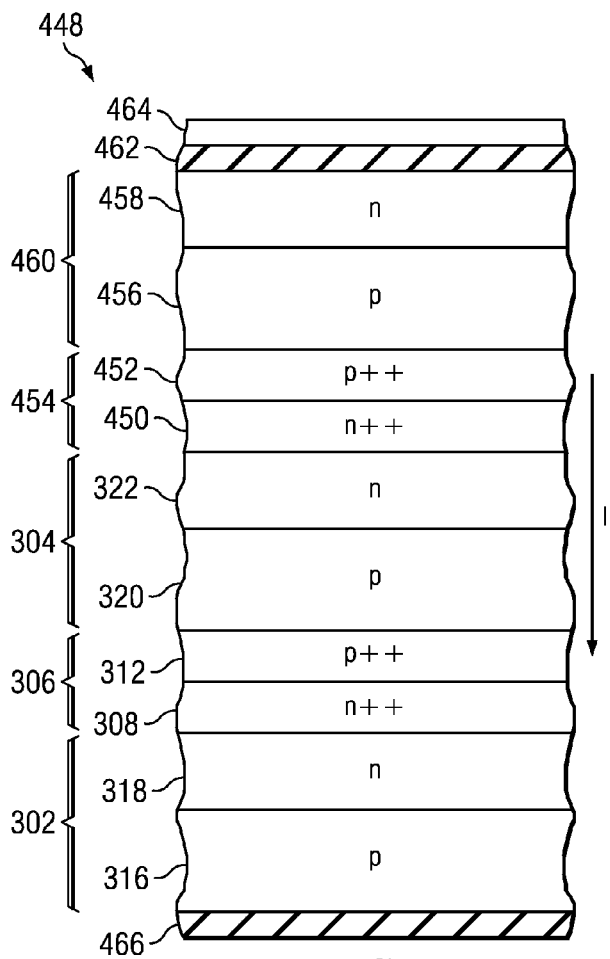
FIG. 5 is a highly magnified schematic elevational sectional view of a portion of a multijunction photovoltaic cell according to a third embodiment of the invention.

Both cell 300 in FIG. 3 and cell 400 in FIG. 4 may additionally include front and back contacts and an upper antireflection layer (described in more detail herein in conjunction with the embodiment shown in FIG. 5).

FIG. 5 illustrates an embodiment of the invention which includes more than two subcells. The illustrated cell 448 has a bottom subcell 302 formed of a Group IV semiconductor material such as silicon, a tunnel homojunction 306 that is formed of layers of Group IV semiconductor material, a middle subcell 304 that is formed of Group II-VI semiconductor material, a tunnel homojunction 454 formed of Group II-VI semiconductor material, and a top subcell 460 that is formed of a Group II-VI semiconductor material.

The bottom subcell 302 includes a (p) base 316 and an (n) emitter 318. The tunnel homojunction 306 includes an (n++) layer 308 consisting of a highly doped Group IV semiconductor material, and on top thereof a (p++) layer 312 consisting of a highly doped Group IV semiconductor material. The second subcell includes a (p) base 320 and an (n) emitter 322. Formed on top of the second subcell is an (n++) layer 450 and a (p++) layer 452, both formed of a Group II-VI semiconductor material. The third subcell 460 includes a (p) base 456 and an (n) emitter 458. The Group II-VI semiconductor material making up layers 456 and 458 preferably is chosen to have a larger band gap than the Group II-VI semiconductor material making up layers 320 and 322. This illustrated embodiment also shows how an antireflective coating 464 and a conductive transparent top contact 462 may be formed above the third subcell 460, and how a conductive bottom contact 466 may be formed to adjoin a bottom surface of the (p) layer 316. Antireflective coatings and top and bottom contacts may be added to the other embodiments illustrated herein. In one variation of the embodiment shown in FIG. 5, all of the conductivity types may be reversed, with the understanding that this may require the use of different Group II-VI alloys. In another variation of the embodiment shown in FIG. 5, the Group IV (n) emitter 318 may be omitted (n++ region 308 then acting as the emitter). In other embodiments, further subcells, preferably of Group II-VI semiconductor materials, could be formed above subcell 460, and preferably each of these subcells will be separated from neighboring subcells by tunnel junctions.

Figure 6:
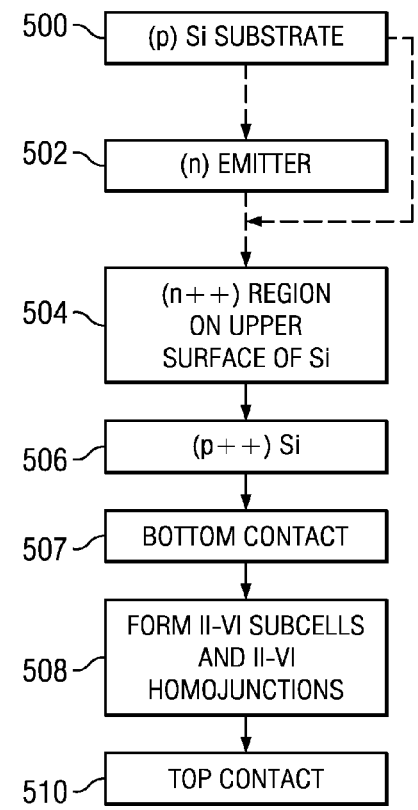
FIG. 6 is a flow diagram showing a method for forming photovoltaic cell to include a tunnel homojunction between a Group II-VI subcell and a Group IV subcell.

Referring to FIG. 6, steps in a representative fabrication method are shown. In a preferred fabrication sequence, the lower, Group IV subcell is formed first. Semiconductors formed with silicon typically are more robust and can better endure steps in semiconductor fabrication sequences than can the typically more delicate Group II-VI compound semiconductors, which therefore are preferred to be fabricated subsequently.

In the illustrated method, at step 500 a (p) type substrate or wafer of Group IV semiconductor material, such as Si, SiGe, or strained SiGe, is provided. Then, in one alternative, at step 502 a moderately to highly doped (n) emitter is created in an upper portion of the Group IV subcell, as by implantation or epitaxial growth on the (p) substrate. In another alternative this step is skipped. If created, the emitter layer could be doped to n or n+, but preferably may be doped to a concentration that is less than that used for the n++ homojunction region.

In either alternative the next step is to create a highly doped (n+ to n++) Group IV lower layer of the tunnel homojunction, at step 504. This layer may be formed by diffusion, ion implantation or growth of a further epitaxial layer. In the case of diffusion, this can be created with either As or P as a dopant at a temperature in the range of 850 to 1000 C using rapid thermal annealing (rta), or a short furnace anneal from a few to about 10 seconds. Alternatively, high dose implantations, with appropriate implantation energies, of either phosphorus or arsenic with a short rta, or with a short furnace anneal in the range of a few to about ten seconds, and at a temperature in the range of about 850 and 950 C, could create this (n++) layer. In another alternative, the (n++) layer could be grown epitaxially.

At step 506, a Group IV upper layer of the homojunction is created. This layer, which preferably is (p++) Si, can be formed by introducing p-type dopants such as boron.

At step 507 (which may occur at any point after step 500 but before any step in which Group II-VI layer(s) are formed) a bottom contact is formed from the bottom of the p-type Group IV semiconductor to a high conductance metallic layer. The bottom surface has a dopant, such as boron or other shallow acceptor, diffused or ion-implanted into it to create a (p++) layer. Then a metallic layer such as aluminum is deposited on the surface.

At step 508, the second, Group II-VI subcell is formed on top of the upper homojunction layer. This and further subcells (and necessary intervening tunnel junctions) can be fabricated by material growth methods such as MBE, MOCVD, and LPE. Layer thicknesses and alloying of the semiconductor thin layers that form the subcells of the multijunction photovoltaic solar cell can be controlled and optimized by adjusting the different raw material compositions, flux rates and deposition durations during the growth to meet the requirements of the specific design for a photovoltaic solar cell.

The resultant multijunction photovoltaic cell is one in which photogenerated current can be passed from a Group II-VI subcell, through a nonblocking path provided by the tunnel homojunction of the invention, to a Group IV subcell.

In summary, several multijunction photovoltaic cells have been proposed in which at least one of the subcells is formed of a Group IV semiconductor material, at least one of the subcells is formed of a Group II-VI semiconductor material, and a homojunction is formed between them to provide a nonblocking contact. While illustrated embodiments of the present invention have been described and illustrated in the appended drawings, the present invention is not limited thereto but only by the scope and spirit of the appended claims.

We claim:

1. A photovoltaic cell having high energy conversion efficiency and comprising:

a first subcell formed of single-crystal silicon and having an upper surface;

a second subcell formed of single-crystal Group II-VI semiconductor material selected from the group consisting of CdZnTe, ZnTe, CdSe, CdMnTe, CdMgTe and composites thereof, and having a bottom surface, the second subcell disposed in the direction of incident light relative to the first subcell; and a tunnel homojunction interposed between the upper surface of the first subcell and the bottom surface of the second subcell, the tunnel homojunction including a first layer comprising highly doped single-crystal silicon, the first layer having a first conductivity type and disposed adjacent the upper surface of the first subcell, the first layer forming one side of a tunnel homojunction; and a second layer comprising highly doped single-crystal silicon, the second layer having a second conductivity type opposite the first conductivity type, the second layer disposed to adjoin the first layer and to be adjacent to the bottom surface of the second subcell, the second layer forming the other side of the tunnel homojunction.

2. The cell of claim 1, wherein the first conductivity type is (n).

3. The cell of claim 1, wherein the first subcell comprises an emitter having the first conductivity type and a base having the second conductivity type and being adjacent to the emitter.

4. The cell of claim 1, wherein the first subcell comprises a base formed to be of the second conductivity type and adjoining the first layer of the tunnel junction, the first layer of the tunnel homojunction acting as an emitter of the first subcell.

* * * * *